(12) United States Patent
Horiuchi et al.

(10) Patent No.: US 11,107,649 B2
(45) Date of Patent: Aug. 31, 2021

(54) KEYBOARD DEVICE

(71) Applicant: Chicony Electronics Co., Ltd., New Taipei (TW)

(72) Inventors: Mitsuo Horiuchi, New Taipei (TW); Chia-Hsin Chen, New Taipei (TW); Po-Hsin Li, New Taipei (TW)

(73) Assignee: CHICONY ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 16/739,695

(22) Filed: Jan. 10, 2020

(65) Prior Publication Data
US 2020/0402744 A1  Dec. 24, 2020

Related U.S. Application Data

(60) Provisional application No. 62/863,428, filed on Jun. 19, 2019.

(30) Foreign Application Priority Data

Aug. 19, 2019 (TW) .................................. 108129534

(51) Int. Cl.
*H01H 13/70* (2006.01)
*H01H 13/7065* (2006.01)
(Continued)

(52) U.S. Cl.
CPC ........ *H01H 13/7065* (2013.01); *H01H 3/125* (2013.01); *H01H 13/14* (2013.01); *H01H 13/81* (2013.01); *H01H 13/86* (2013.01); *H01R 12/59* (2013.01); *H05K 1/189* (2013.01); *H01H 2207/026* (2013.01); *H01H 2231/002* (2013.01); *H05K 2201/10053* (2013.01); *H05K 2201/10393* (2013.01)

(58) Field of Classification Search
CPC ..... H01H 13/7065; H01H 3/125; H01H 13/14
USPC .................................................. 200/341, 5 A
See application file for complete search history.

(56) References Cited

U.S. PATENT DOCUMENTS 6,805,507 B2 * 10/2004 Tsai ........................ H01H 3/125
200/237
2010/0243419 A1 * 9/2010 Lee ..................... H01H 13/705
200/344

(Continued)

*Primary Examiner* — Edwin A. Leon
*Assistant Examiner* — Iman Malakooti
(74) *Attorney, Agent, or Firm* — Muncy, Geissler, Olds & Lowe, P.C.

(57) ABSTRACT

A keyboard device includes a substrate, a connection hook, a keycap, and a connecting member. The substrate has a top surface including an assembly area. The connection hook is disposed on the assembly area and includes a fixed seat fixed on the substrate, a standing portion, and a reinforcement block. The standing portion is extending from the fixed seat and extending in a direction away from the fixed seat. A hook portion is laterally extending from a top end of the standing portion, the hook portion has a bottom edge. The reinforcement block is connected to the standing portion and the bottom edge. The keycap is disposed on the assembly area. The connecting member is connected between the keycap and the assembly area. The connecting member includes a shaft slidably pivoted at the bottom edge. An inner side of the shaft includes an avoidance groove corresponding to the reinforcement block.

8 Claims, 5 Drawing Sheets

(51) Int. Cl.
*H01H 3/12* (2006.01)
*H01H 13/14* (2006.01)
*H01H 13/81* (2006.01)
*H01H 13/86* (2006.01)
*H01R 12/59* (2011.01)
*H05K 1/18* (2006.01)

(56) References Cited

U.S. PATENT DOCUMENTS

2019/0221385 A1\* 7/2019 Chang et al. .......... H01H 13/88
　　　　　　　　　　　　　　　　　　　　　　　200/341
2019/0237278 A1\* 8/2019 Yen ........................ H01H 13/83

\* cited by examiner

KEYBOARD DEVICE

CROSS-REFERENCES TO RELATED APPLICATIONS

This application claims the priority benefit of U.S. provisional application Ser. No. 62/863,428, filed on Jun. 19, 2019 and Patent Application No. 108129534 filed in Taiwan, R.O.C. on Aug. 19, 2019. The entirety of the above-mentioned patent applications are hereby incorporated by references herein and made a part of the specification.

BACKGROUND

Technical Field

The instant disclosure relates to an input device, in particular, to a keyboard device.

Related Art

Keyboards are common input devices. Usually, they are used along with daily computer products (such as laptops, notebook computers, smart phones, or tablets) or industrial scaled control equipment or processing equipment.

In general, a keyboard known to the inventor(s) has a substrate and several keycaps disposed on the substrate. Generally, a connecting member (such as a scissor connecting member) is disposed between each of the keycaps and the substrate. Hence, when the keycap is pressed, the keycap can be guided by the connecting member to perform an up-and-down movement relative to the substrate.

SUMMARY

However, the connecting member is a one-piece hook structure assembled on the substrate and formed by integrally bending the substrate. In response to the "thin and light" trend in manufacturing the substrate, the structural strength of the hook structure is also reduced. As a result, upon being forced, the hook structure may be deformed easily or even broken.

In view of this, in one embodiment, a keyboard device is provided. The keyboard comprises a substrate, a connection hook, a keycap, and a connecting member. The substrate has a top surface, and the top surface comprises an assembly area. The connection hook is disposed on the assembly area. The connection hook comprises a fixed seat, a standing portion, and a reinforcement block. The fixed seat is fixed on the substrate. The standing portion is extending from the fixed seat and extending in a direction away from the fixed seat. A hook portion is laterally extending from a top end of the standing portion, and the hook portion has a bottom edge. The bottom edge extends along an extension direction and has an extension length, and the extension direction is parallel to the top surface of the substrate. The reinforcement block is connected to the standing portion and the bottom edge of the hook portion. The keycap is disposed on the assembly area of the substrate. The connecting member is connected between the keycap and the assembly area. The connecting member comprises a shaft slidably pivoted at the bottom edge of the hook portion. The shaft comprises an inner side and an outer side opposite to the inner side. The inner side is near to the standing portion with respect to the outer side. The inner side of the shaft comprises an avoidance groove corresponding to the reinforcement block.

Based on the above, in the keyboard device according to the one or some embodiments of the instant disclosure, the reinforcement block is connected to the standing portion and the bottom edge of the hook portion of the connection hook. Therefore, the overall structural strength of the connection hook can be improved. Moreover, when the hook portion is forced, the stress can be prevented from being concentrated at the corner between the standing portion and the hook portion, thereby preventing the hook portion from being broken easily or from exceeding the elasticity limit. Accordingly, the drawing force of the connection hook can be improved greatly. Furthermore, the inner side of the shaft comprises the avoidance groove for corresponding to the reinforcement block. Hence, during the operation of the keyboard device, the movement of the connecting member can be prevented from being interfered by the reinforcement block. Hence, the connecting member can still have a proper structural strength.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
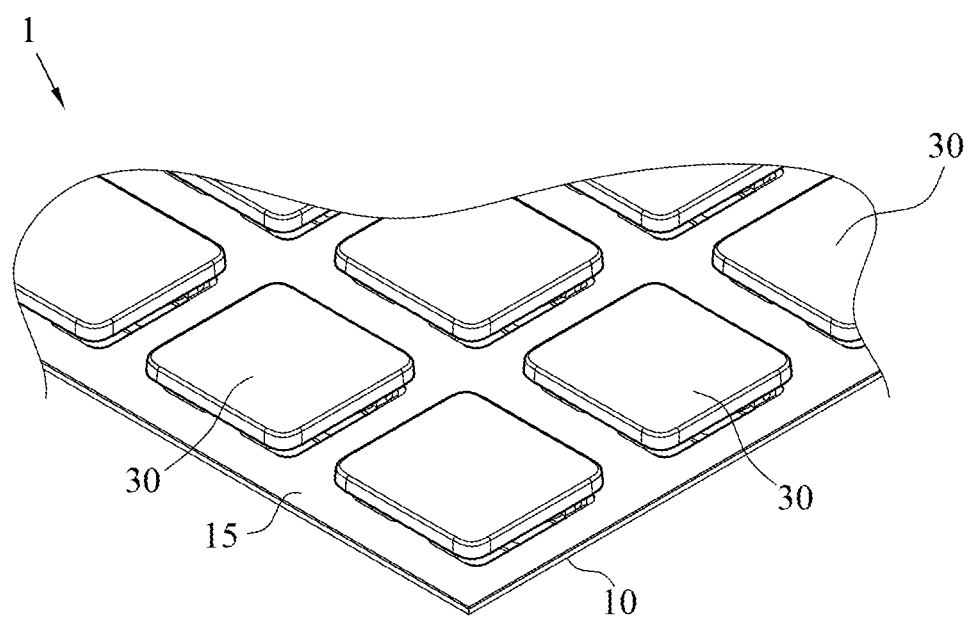
FIG. 1 illustrates a partial perspective view of a keyboard device according to an exemplary embodiment of the instant disclosure.
Figure 2:
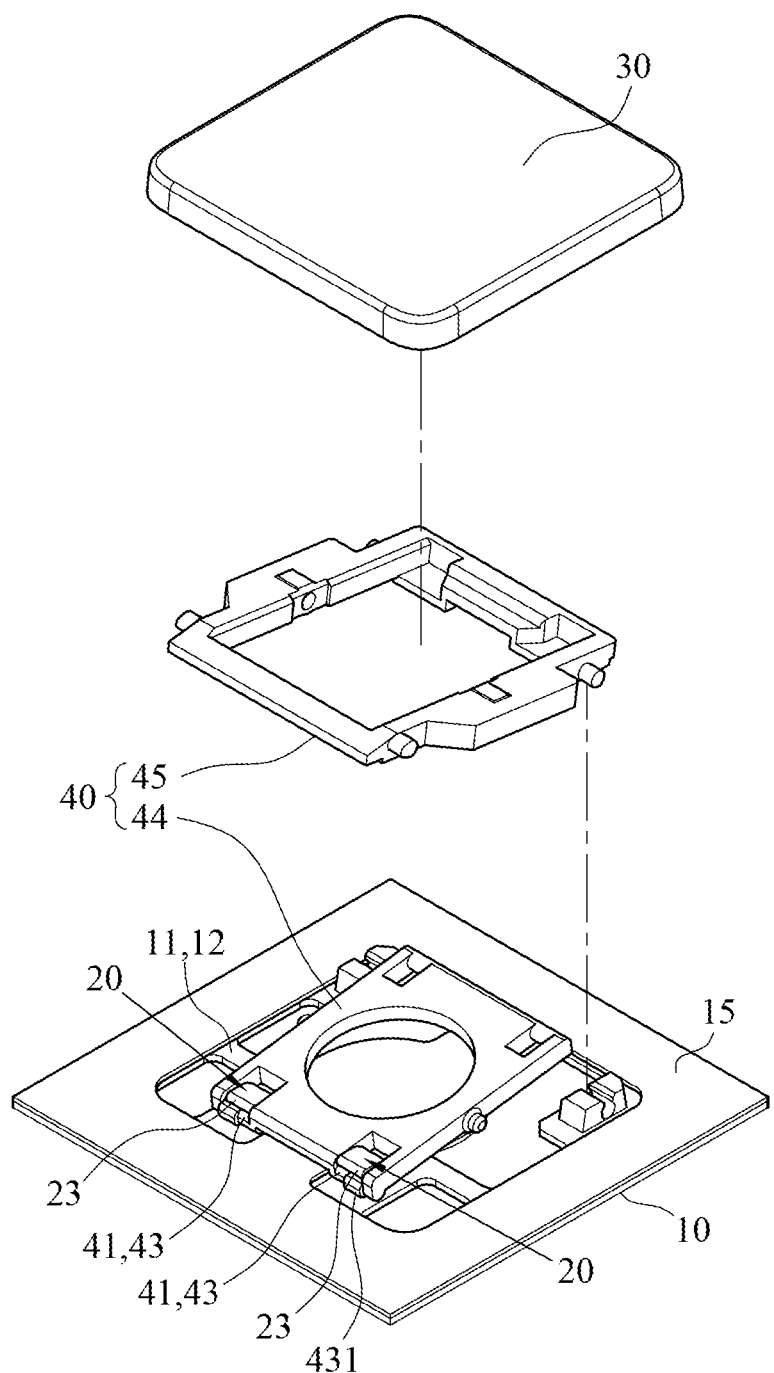
FIG. 2 illustrates a partial exploded view of a keyboard device according to an exemplary embodiment of the instant disclosure.
Figure 3:
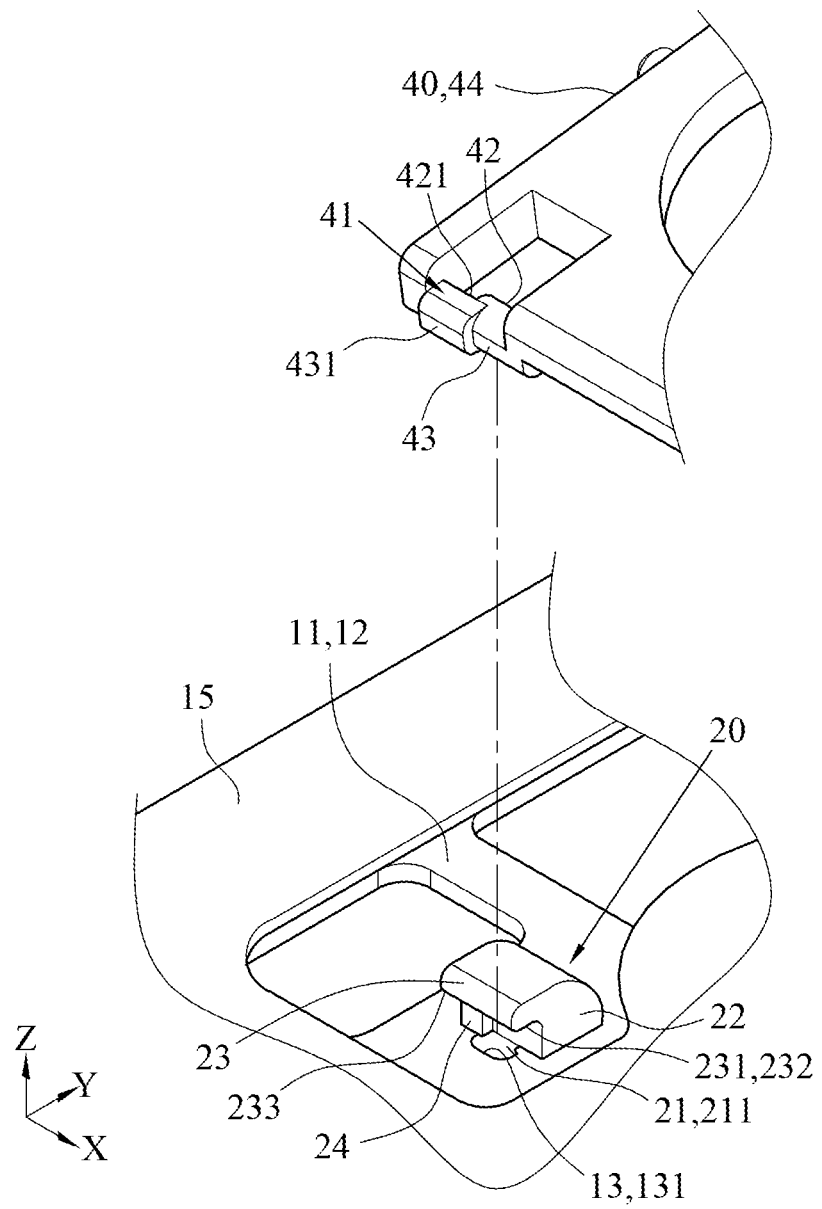
FIG. 3 illustrates an enlarged partial exploded view of a keyboard device according to an exemplary embodiment of the instant disclosure.

FIG. 1 illustrates a partial perspective view of a keyboard device 1 according to an exemplary embodiment of the instant disclosure. FIG. 2 illustrates a partial exploded view of a keyboard device 1 according to an exemplary embodiment of the instant disclosure. FIG. 3 illustrates an enlarged partial exploded view of a keyboard device 1 according to an exemplary embodiment of the instant disclosure. As shown in FIGS. 1 to 3, in this embodiment, the keyboard device 1 comprises a substrate 10, a plurality of connection hooks 20, a plurality of keycaps 30, and a plurality of connecting members 40. The keyboard device 1 may be utilized in different electronic devices (e.g., laptops, notebooks, or input devices of other electronic devices), and users can operate the keyboard device 1 to generate corresponding signal(s).

As shown in FIGS. 1 and 2, for example, the keyboard device 1 may be a computer keyboard, and a membrane circuit board 15 may be disposed on the substrate 10. The keycaps 30 may comprise, for example, a plurality of alphabet keys, a plurality of number keys, a space key, an enter key, and a caps lock key. The keycaps 30 are disposed and arranged on the membrane circuit board 15. Each of the connecting members 40 is connected between the substrate 10 and the corresponding keycap 30 for guiding the corresponding keycap 30 to perform an up-and-down movement (as shown in FIG. 2, in this embodiment, one keycap 30 and one connecting member 40 are presented for illustrative purposes). When the keycap 30 is pressed, the keycap 30 is moved toward the membrane circuit board 15 downwardly to trigger a signal; conversely, when the keycap 30 is released, the keycap 30 is moved upwardly to a position where the keycap 30 is not pressed.

As shown in FIGS. 1 to 3, the substrate 10 may be a rigid plate made of metal (e.g., iron, aluminum, alloy, etc.), or plastic material. The substrate 10 has a top surface 11, and the top surface 11 comprises a plurality of assembly areas 12. The assembly area 12 is an area for assembling the keycap 30 on the substrate 10 (for example, an area of the substrate 10 exposed from the membrane circuit board 15 as shown in FIG. 2).

As shown in FIGS. 1 to 3, each of the assembly areas 12 of the substrate 10 comprises a plurality of connection hooks 20 for assembling with the connecting members 40. In this embodiment, the assembly area 12 of the substrate 10 comprises two connection hooks 20, but the number of the connection hooks 20 is not limited thereto. Each of the connection hooks 20 comprises a fixed seat 21, a standing portion 22, and a reinforcement block 24. The fixed seat 21 is fixed on the substrate 10. The standing portion 22 is extending from the fixed seat 21 and extending in a direction away from the fixed seat 21 (as shown in FIG. 3, in this embodiment, the standing portion 22 is extending upwardly along the Z axis direction and is extending away from the fixed seat 21 and the top surface 11 of the substrate 10). A hook portion 23 is laterally extending from the top end of the standing portion 22, and the hook portion 23 has a bottom edge 231.

Figure 4:
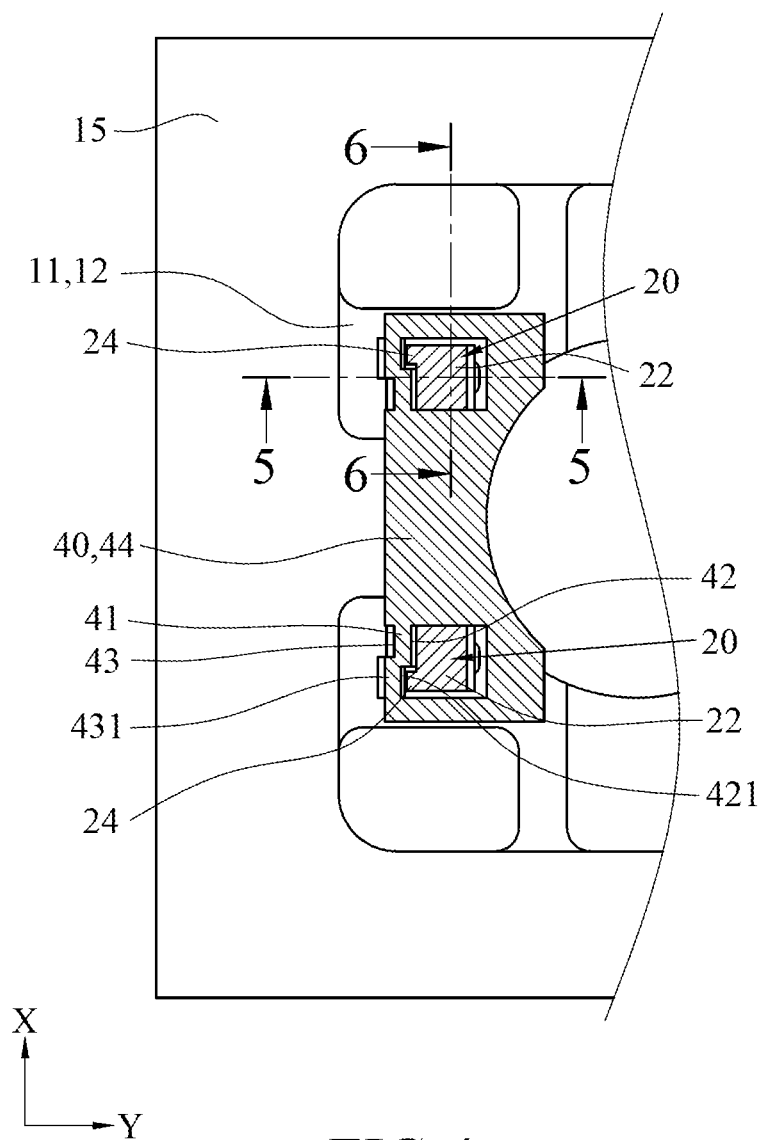
FIG. 4 illustrates a cross-sectional view of a keyboard device according to an exemplary embodiment of the instant disclosure.
Figure 5:
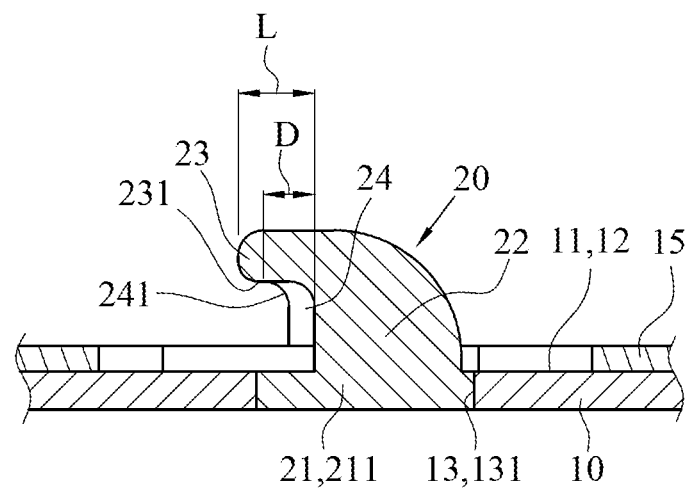
FIG. 5 illustrates a cross-sectional view along line 5-5 shown in FIG. 4.

Please refer to FIGS. 3 to 5. FIG. 4 illustrates a cross-sectional view of a keyboard device 1 according to an exemplary embodiment of the instant disclosure. FIG. 5 illustrates a cross-sectional view along line 5-5 shown in FIG. 4. In this embodiment, the bottom edge 231 of the hook portion 23 of each of the connection hooks 20 extends along an extension direction and has an extension length L (as shown in FIG. 3, in this embodiment, the bottom edge 231 is extending along the Y axis direction and parallel to the top surface 11 of the substrate 10). The reinforcement block 24 is connected to the standing portion 22 and the bottom edge 231 of the hook portion 23 for structural reinforcement. Hence, the drawing force of the hook portion 23 can be enhanced. Moreover, a width D of the reinforcement block 24 is less than the extension length L of the bottom edge 23, so that the reinforcement block 24 does not protrude out of the bottom edge 231.

Figure 6:
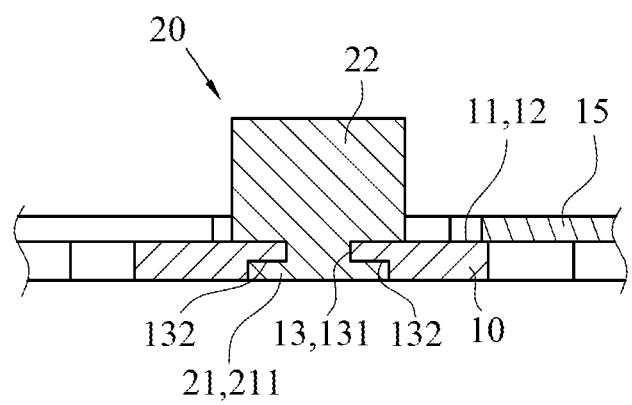
FIG. 6 illustrates a cross-sectional view along line 6-6 shown in FIG. 4.

Please refer to FIGS. 2 to 5, in some embodiments, the assembly area 12 of the substrate 10 comprises a plurality of fixing members 13. Each of the connection hooks 20 is an independent component, and the fixed seat 21 of each of the connection hooks 20 is fixed on the corresponding fixing member 13. For example, in this embodiment, each of the fixing members 13 is an insertion hole 131 defined through the substrate 10. The fixed seat 21 of each of the connection hooks 20 is engaged in the corresponding insertion hole 131 by a manner of insert molding, outsert molding or other molding methods. so that the fixed seat 21 of each of the connection hooks 20 has an engaging structure 211 for being engaged in the corresponding insertion hole 131. Please further refer to FIGS. 5 and 6. FIG. 6 illustrates a cross-sectional view along line 6-6 shown in FIG. 4. In this embodiment, the periphery of the insertion hole 131 has at least one engaging groove 132. The shape of the engaging structure 211 corresponds to the shape of the insertion hole 131, and the engaging structure 211 is correspondingly engaged in the engaging groove 132. Accordingly, the connection hook 20 according to one or some embodiments of the instant disclosure is integrally formed as a one-piece structure and the structural strength of the connection hook 20 can be greatly improved. Moreover, as compared with the hook formed by bending the substrate known to the inventor (s), since the connection hook 20 according to one or some embodiments of the instant disclosure is an independent component (with respect to the substrate 10), the structural strength of the connection hook 20 is not affected when the thickness of the substrate 10 is reduced. Consequently, the keyboard device 1 can achieve the "thin and light" trend.

Moreover, as shown in FIGS. 3 to 5, in this embodiment, the reinforcement block 24 of each of the connection hooks 20 is further connected to a corner between the standing portion 22 and the bottom edge 231 of the hook portion 23. Moreover, the reinforcement block 24 further downwardly extends to connect to the fixed seat 21. Hence, the structural reinforcement effect of the reinforcement block 24 can be further enhanced, thereby improving the drawing force of the hook portion 23. In some embodiments, the bottom edge 231 of the hook portion 23 of each of the connection hooks 20 comprises a first side 232 and a second side 233 opposite to the first side 232. As shown in FIGS. 3 and 4, in this embodiment, the reinforcement block 24 of one of the two connection hooks 20 is near to the first side 232, and the reinforcement block 24 of the other connection hook 20 is near to the second side 233, but embodiments are not limited thereto. The reinforcement block 24 may be located between the first side 232 and the second side 233 of the bottom edge 231 of the hook portion 23.

As shown in FIGS. 1 to 4, each of the keycaps 30 is disposed on the corresponding assembly area 12 of the substrate 10, and each of the connecting members 40 is connected between the corresponding keycap 30 and the corresponding assembly area 12. The connecting member 40 comprises a plurality of shafts 41. Each of the shafts 41 is slidably pivoted at the bottom edge 231 of the hook portion 23 of the corresponding connecting hook 20. For example, in this embodiment, the connecting member 40 is a scissor connecting member and comprises an inner frame 44 and an outer frame 45 pivoted at a middle portion of the inner frame 44, and the shafts 41 are disposed on the inner frame 44 for respectively pivoting with the two connection hooks 20, but embodiments are not limited thereto. In some embodiments, several shafts 41 may be disposed on the outer frame 45, and the substrate 10 may further comprise connection hooks 20 for pivoting with the shafts 41 of the outer frame 45.

Furthermore, as shown in FIGS. 3 and 4, the shaft 41 of each of the connecting members 40 comprises an inner side 42 and an outer side 43 opposite to the inner side 42, and the inner side 42 is near to the standing portion 22 with respect to the outer side 43; in other words, the distance between the inner side 42 and the standing portion 22 is less than the distance between the outer side 43 and the standing portion 22. Moreover, the inner side 42 of the shaft 41 comprises an avoidance groove 421, and the avoidance groove 421 corresponds to the reinforcement block 24. Further, as shown in FIGS. 4 and 6, since the width D of the reinforcement block 24 is less than the extension length L of the bottom edge 231 and the reinforcement block 24 does not protrude out of the bottom edge 231, the shaft 41 of the connecting member 40 does not have to be completely truncated. Hence, in this embodiment, parts of the shaft 41 are removed to form the avoidance groove 421 for avoiding the reinforcement block 24. Accordingly, the structure of the shaft 41 can be prevented from being damaged and the assembly manner between the connecting member 40 and the connection hook 20 can be retained.

Accordingly, as shown in FIGS. 2 and 3, when each of the keycaps 30 is pressed to have an up-and-down movement relative to the substrate 10, the keycap 30 drives the connecting member 40 to move, so that the shaft 41 is moved in the extension direction of the bottom edge 231 of the hook portion 23. In one or some embodiments of the instant disclosure, the standing portion 22 and the bottom edge 231 of the hook portion 23 are connected by the reinforcement block 24. Hence, the overall structural strength of the connection hook 20 can be improved. Moreover, when the hook portion 23 is forced upwardly (such as when the hook portion 23 is pulled upwardly), the stress can be prevented from being concentrated at the corner between the standing portion 22 and the hook portion 23, thereby preventing the hook portion 23 from being broken easily or from exceeding the elasticity limit. Accordingly, the drawing force of the connection hook 20 can be improved greatly.

Moreover, according to one or some embodiments of the instant disclosure, the inner side 42 of the shaft 41 comprises the avoidance groove 421 for corresponding to the reinforcement block 24. Hence, during the operation of the keyboard device 1, the movement of the connecting member 40 can be prevented from being interfered by the reinforcement block 24. Moreover, parts of the inner side 42 of the shaft 41 are removed to maintain the connection manner between the connecting member 40 and the connection hook 20, and the connecting member 40 can still have a proper structural strength. In some embodiments, as shown in FIGS. 3 and 4, a thickening portion 431 may be protruding from the outer portion 43 of each of the shafts 41 of the connecting member 40. Therefore, the thickness of the shaft 41 can be increased to provide a structural reinforcement function. In this embodiment, the thickening portion 431 is located at an opposite side opposite to the avoidance groove 421. In other words, for the shaft 41, portions with insufficient structural strengths can be thickened so as to maintain the overall structural strength in a proper condition.

Moreover, as shown in FIG. 5, the reinforcement block 24 of each of the connection hooks 20 further has a curved edge 241. The curved edge 241 is the edge of the reinforcement block 24 distant from the standing portion 22, and the curved edge 241 is connected to the bottom edge 231 of the hook portion 23. In this embodiment, the curved edge 241 is a radius-angle curved edge, so that a corner between the reinforcement block 24 and the bottom edge 231 of the hook portion 23 forms a smooth curve, thereby facilitating in reducing the stress at the corner. In some embodiments, the curved edge 241 of the reinforcement block 24 may be a logarithmic curved edge, a parabolic curved edge, or a hyperbolic curved edge.

Based on the above, in the keyboard device 1 according to the one or some embodiments of the instant disclosure, the reinforcement block 24 is connected to the standing portion 22 and the bottom edge 231 of the hook portion 23 of the connection hook 20. Therefore, the overall structural strength of the connection hook 20 can be improved. Moreover, when the hook portion 23 is forced, the stress can be prevented from being concentrated at the corner between the standing portion 22 and the hook portion 23, thereby preventing the hook portion 23 from being broken easily or from exceeding the elasticity limit. Accordingly, the drawing force of the connection hook 20 can be improved greatly. Furthermore, the inner side 42 of the shaft 41 comprises the avoidance groove 421 for corresponding to the reinforcement block 24. Hence, during the operation of the keyboard device 1, the movement of the connecting member 40 can be prevented from being interfered by the reinforcement block 24. Hence, the connecting member 40 can still have a proper structural strength.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A keyboard device comprising:
   a substrate having a top surface, wherein the top surface comprises an assembly area;
   a connection hook disposed on the assembly area, wherein the connection hook comprises a fixed seat, a standing portion, and a reinforcement block; the fixed seat is fixed on the substrate, the standing portion is extending from the fixed seat and extending in a direction away from the fixed seat; a hook portion is laterally extending from a top end of the standing portion, the hook portion has a bottom edge; the bottom edge extends along an extension direction and has an extension length, and the extension direction is parallel to the top surface; the reinforcement block is connected to a corner between the standing portion and the bottom edge of the hook portion;
   a keycap disposed on the assembly area of the substrate; and
   a connecting member connected between the keycap and the assembly area, wherein the connecting member comprises a shaft slidably pivoted at the bottom edge of the hook portion of the connection hook, the shaft comprises an inner side and an outer side opposite to the inner side, the inner side is near to the standing portion with respect to the outer side, the inner side of the shaft comprises an avoidance groove corresponding to the reinforcement block;
   wherein the assembly area of the substrate comprises a fixing member, and the fixed seat of the connection hook is fixed on the fixing member, the fixing member is an insertion hole, the fixed seat of the connection hook has an engaging structure for being engaged in the insertion hole.

2. The keyboard device according to claim 1, wherein a thickening portion is further protruding from the outer side of the shaft of the connecting member.

3. The keyboard device according to claim 2, wherein the thickening portion is located at an opposite side opposite to the avoidance groove.

4. The keyboard device according to claim 1, wherein the reinforcement block is further connected to the fixed seat.

5. The keyboard device according to claim 1, wherein the reinforcement block has a curved edge, and the curved edge is connected to the bottom edge of the hook portion.

6. The keyboard device according to claim 5, wherein the curved edge is a logarithmic curved edge, a parabolic curved edge, a hyperbolic curved edge or a radius-angle curved edge.

7. The keyboard device according to claim 1, wherein the connection hook is integrally formed as a one-piece structure.

8. The keyboard device according to claim 1, wherein the bottom edge of the hook portion comprises a first side and a second side opposite to the first side, and the reinforcement block is near to the first side or near to the second side.

* * * * *